United States Patent [19]

Hirayama

[11] Patent Number: 4,822,756
[45] Date of Patent: Apr. 18, 1989

[54] REACTION FURNACE AND METHOD OF OPERATING THE SAME

[75] Inventor: Makoto Hirayama, Hyogo, Japan
[73] Assignee: Mitsubishi Denki Kabushiki Kaisha, Tokyo, Japan
[21] Appl. No.: 124,430
[22] Filed: Nov. 18, 1987

[30] Foreign Application Priority Data

Nov. 19, 1986 [JP] Japan .............................. 61-277031

[51] Int. Cl.$^4$ .................... H01L 21/324; H01L 21/20
[52] U.S. Cl. .................................. 437/247; 118/719; 437/939
[58] Field of Search ................. 437/247, 939; 118/719

[56] References Cited

U.S. PATENT DOCUMENTS

| | | | |
|---|---|---|---|
| 4,016,006 | 4/1977 | Yoshinaka et al. | 437/247 |
| 4,081,313 | 3/1978 | McNeilly et al. | 437/247 |
| 4,258,645 | 3/1981 | Aichert et al. | 118/719 |
| 4,498,416 | 2/1985 | Bouchaib | 118/719 |
| 4,547,256 | 10/1985 | Gurtler et al. | 437/247 |
| 4,575,408 | 3/1986 | Bok | 118/719 |
| 4,607,593 | 8/1986 | Van Hemel | 118/719 |
| 4,666,734 | 5/1987 | Kamiya et al. | 118/719 |
| 4,698,486 | 10/1987 | Sheets | 118/725 |
| 4,733,631 | 3/1988 | Boyarsky et al. | 118/719 |

OTHER PUBLICATIONS

Collection of New Technique or ULSI Factory-New Process and Automation, pp. 118-123, Realize Co., Japan, 1986.
Automation of LSI Factory-Collection of New Process Technique, pp. 176-184, Realize Co., Japan, 1984.
Electronic Material in Separate Volume-Guide Book for ULSI Manufacturing-Testing Device, pp. 54-56, Japan, 1986.
Electronic Material in Separate Volume-Guide Book for ULSI Manufacturing/Testing Device, pp. 79-83, Japan, 1986.

Primary Examiner—Upendra Roy
Attorney, Agent, or Firm—Lowe, Price, LeBlanc, Becker & Shur

[57] ABSTRACT

The present invention comprises a reaction furnace including a fixed capsule having an air atmosphere to be replaced with a predetermined atmosphere, with a semiconductor member to be treated placed therein. A movable capsule initially receives the member and has an atmosphere replaced with a predetermined one before the member to be treated is transferred to the fixed capsule. The movable capsule receives the member at a receiving location and is moved to a delivery location where it is connected to a loading chamber. A method of operating the reaction furnace is also disclosed.

20 Claims, 5 Drawing Sheets

REACTION FURNACE AND METHOD OF OPERATING THE SAME

BACKGROUND OF THE INVENTION

1. Field of the Invention

The present invention relates to a reaction furnace and a method of operating the same and, more particularly, relates to a suitable reaction furnace for use in a manufacturing process of a semiconductor device and a method operating the same.

2. Description of the Prior Art

An oxidation diffusion furnace is used in general as a reaction furnace. (For example, Collection of New Technique of ULSI Factory-New Process and Automation, pp. 118–123, Realize Co., Japan, 1986; Automation of LSI Factory-Collection of New Process Technique, pp. 176–184, Realize Co., Japan, 1984; Electronic Material in Separate Volume-Guide Book for ULSI Manufacture/Testing Device, pp. 54–56, pp. 79–83, Japan, 1986).

Conventionally, such type of reaction furnace is structured as shown in FIG. 1. An outline of such reaction furnace will be described with reference to FIG. 1. Referring to FIG. 1, a container 1 has a horizontal type of treatment chamber 4 capable of housing a boat 3 holding a member 2 to be treated such as a semiconductor wafer. A gas inlet 5 and a vacuum outlet 6 are connected to the container 1. In the thus structured reaction furnace, the treatment chamber 4 housing the boat 3 holding the member 2 to be treated is evacuated. By letting various kinds of gas be introduced in this chamber from the inlet 5, a thin film can be formed on the surface of the heated member 2 to be treated.

In addition, there are some methods of heating the member 2 to be treated, that is, by means of a resistance wire, infrared lamp, or high frequency.

A reaction furnace of a type shown in FIG. 2 is also employed in the prior art, wherein a container 7 comprises a treatment chamber 10 having two electrodes 8 and 9 at upper and lower portions thereof. The electrodes 8 and 9 are arranged in the container 7. A member 11 to be treated such as a semiconductor wafer is positioned on the lower electrode 9. Also, a gas inlet 12 and vacuum outlets 13 are connected to said container 7.

In the thus structured reaction furnace, the treatment chamber 10 is evacuated, with the member 11 to be treated placed on the lower electrode 9 in the container 7. By letting various kinds of gas be introduced in this chamber from the gas inlet 12 and applying a direct current high voltage between both electrodes 8 and 9, a thin film can be formed on the surface of the member 11 to be treated.

With the above conventional reaction furnaces, it is necessary to take in and out the members 2 and 11 to be treated between the atmosphere and the treatment chamber 4 and 10 during the treatment. At that time, the temperature is very high in the treatment chamber 4 and 10. Therefore, the members 2 and 11 to be treated are heated before the treatment starts and they react with the air in the treatment chambers 4 and 10. Also, the air comes in contact with the heated members 2 and 11 to be treated after the treatment. Thus, an undesirable film was formed on the members 2 and 11 to be treated, whereby problems were caused that it was difficult to control a film thickness and this film with a uniform thickness can not be formed.

SUMMARY OF THE INVENTION

In view of these circumstances, the present invention was made so as to provide a stabilized condition of the members to be treated in a treatment chamber. More preferably, the present invention provides a reaction furnace capable of accurately controlling the film thickness of a semiconductor device and forming a thin film with a uniform thickness, and a method of operating the same.

A reaction furnace in accordance with the present invention comprises fixed capsule means an atmosphere of which is replaced with a predetermined atmosphere, with the member to be treated housed therein, for applying a reaction treatment onto the member to be treated, movable capsule means an atmosphere of which is replaced with a predetermined atmosphere, with the member to be treated contained therein, connection means connected to said both capsule means and capable of transferring the member to be treated between both capsule means.

In addition, a method of operating a reaction furnace in accordance with the present invention comprises the steps of housing the member to be treated in movable capsule means, replacing an atmosphere in the movable capsule means with a predetermined one, connecting said movable capsule means to be fixed capsule means the atmosphere of which is replaced with a predetermined one for applying a reaction treatment onto the member to be treated, moving the member to be treated from the movable capsule means to the fixed capsule means thereafter, and applying a reaction treatment onto the member to be treated in the fixed capsule means.

According to the present invention, by replacing the atmospheres in both capsule means with predetermined ones, contact of the member to be treated with the air can be avoided before and after the main treatment. Therefore, for example, a film thickness can be controlled accurately in forming a film on the member to be treated and a thickness of a thin film can be set to be uniform.

These objects and other objects, features, aspects and advantages of the present invention will becomes more apparent from the following detailed description of the present invention when taken in conjunction with the accompanying drawings.

DESCRIPTION OF THE PREFERRED EMBODIMENTS

Figure 1:
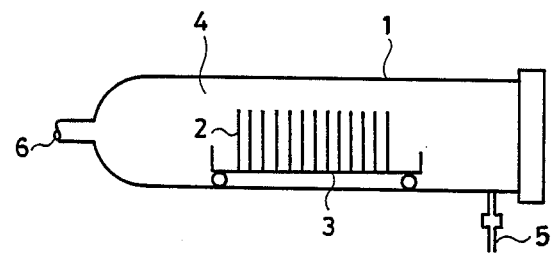
FIGS. 1 and 2 are sectional views each showing a conventional reaction furnace.
Figure 2:
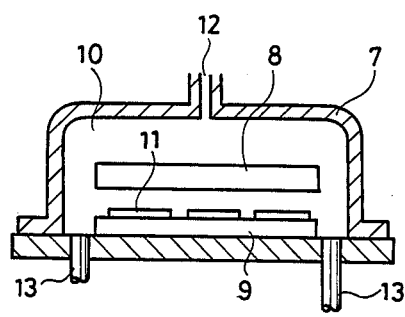
Figure 3A:
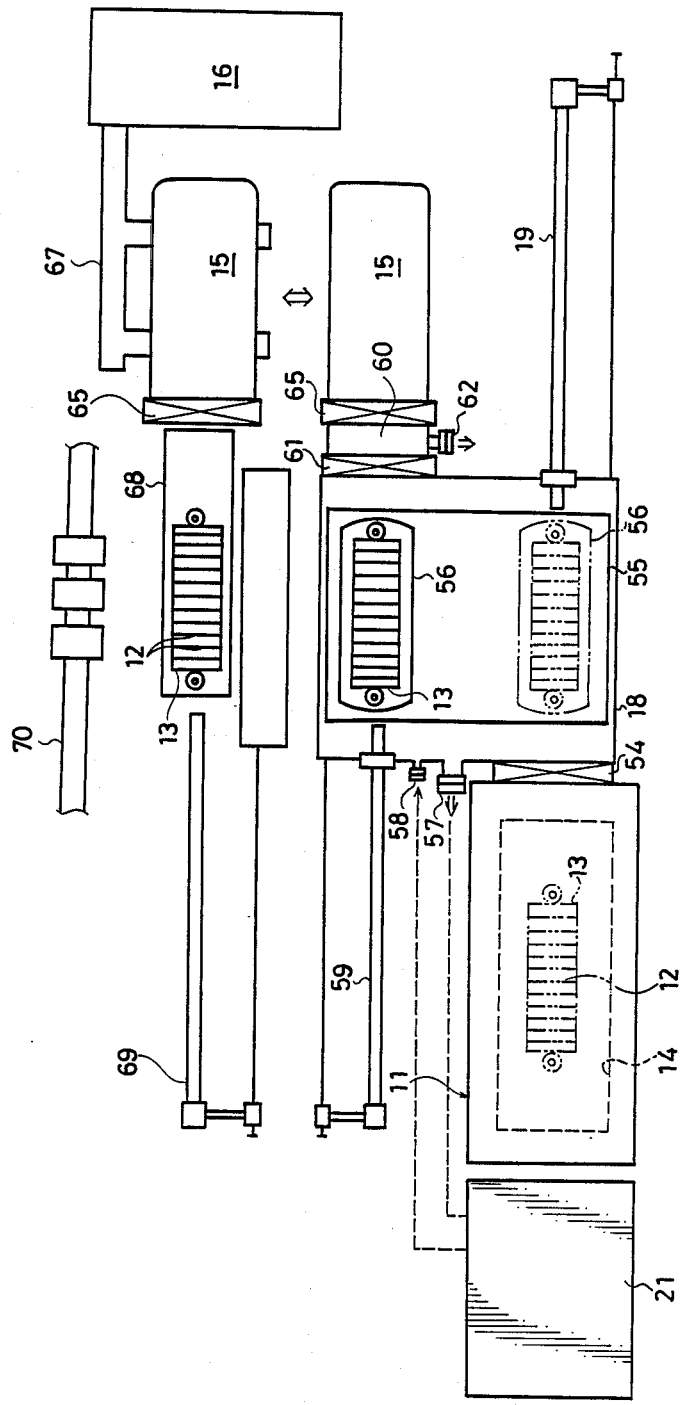
FIG. 3A is a partial cross sectional plan view showing a reaction furnace in accordance with the present invention.
Figure 3B:
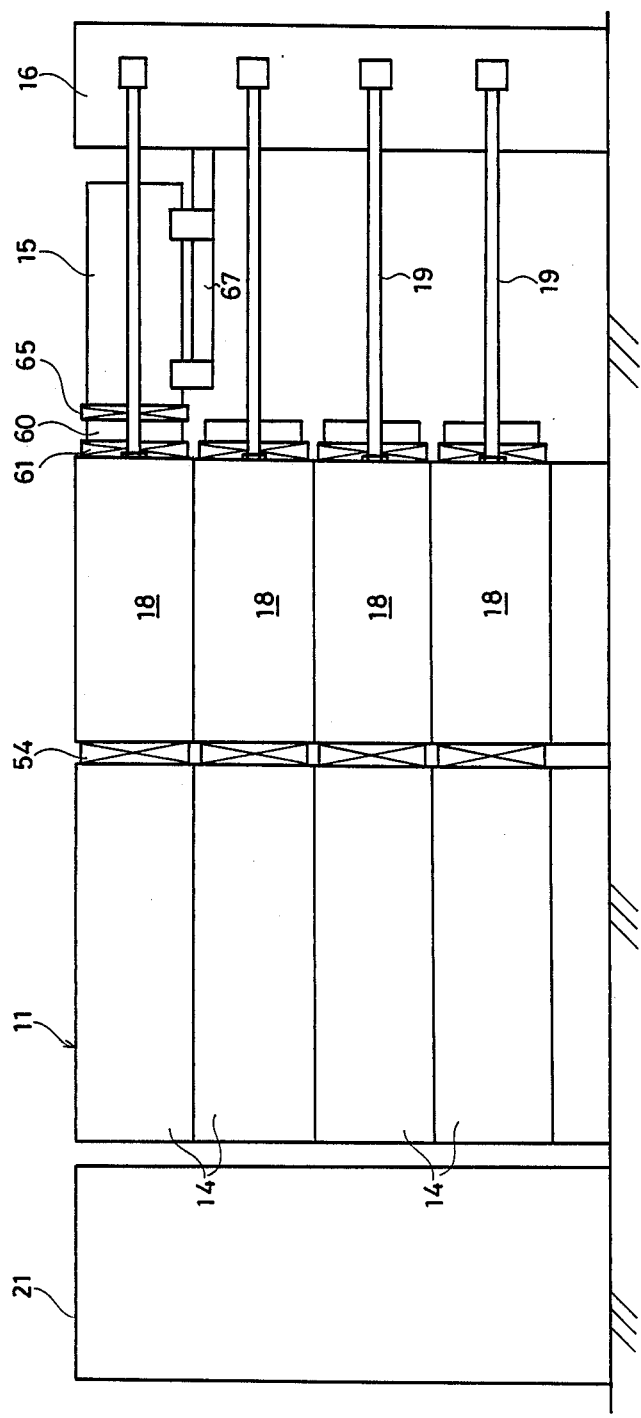
FIG. 3B is a front view showing a reaction furnace in accordance with the present invention.
Figure 3C:
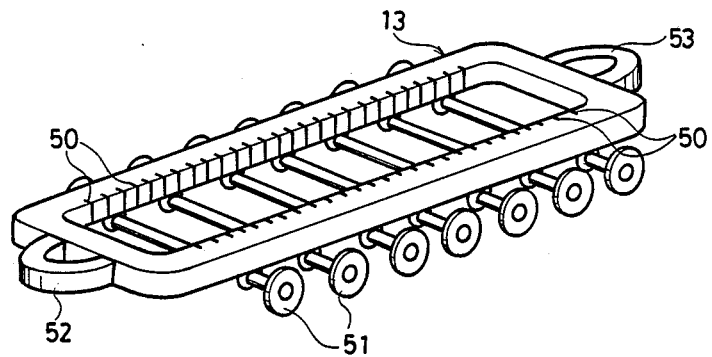
FIG. 3C is a perspective view showing a support board.

Referring to FIGS. 3A and 3B, four treatment chambers 14 capable of housing a support boat 13 for carrying a wafer as a member to be treated, is formed in a main container 11 as a fixed capsule. The support boat 13 is a frame-type boat made of quartz, as shown in FIG. 3C, having a number of wafer supporting grooves 50 disposed therein at equal intervals in the longitudinal direction. The wafers 12 are inserted from above portion to the grooves 50 one by one, whereby the wafers 12 are caused to stand upright on the boat. A number of wheels 51 are rotatably provided spaced apart and distributed in the longitudinal direction of the boat under the support boat 13. A pair of engaging portions 52 and 53 are provided on both ends of the support boat 13 in the longitudinal direction. Meanwhile, a slidable sledge may be provided in the longitudinal direction of the boat in place of the wheels 51.

As shown in FIG. 3B, treatment chambers 14 of the main container 11 are provided in four stages stacked in the vertical direction, and loading chambers 18 are provided accordingly in four stages stacked in the vertical direction. Gate valves 54 are each provided between the treatment chambers 14 and the corresponding loading chambers 18, respectively. Each gate valve 54 is provided so as to establish communication or interruption between each treatment chamber 14 and the corresponding loading chamber 18.

As shown in FIG. 3A, a belt conveyor 55 is placed in the loading chamber 18 and a pan 56 is attached on the belt conveyor 55. The pan 56 is made of quartz and can be moved in vertical and horizontal directions with respect to the longitudinal direction of the boat 13 by the belt conveyor 55. A boat loader 19 is placed on the opposite side of the main container 11 of the loading chamber 18. The tip end of the boat loader 19 on the side of the loading chamber 18 has a hook configuration and can engage with the engaging portion 53 of the support boat 13. In addition, the boat loader 19 can be driven in a longitudinal direction of the treatment chamber 14, whereby the support boat 13 can be moved between the treatment chamber 14 and the pan 56.

The loading chamber 18 has an outlet 57 and a substitution gas inlet 58. Outlet 57 and substitution gas inlet 58 are connected to an apparatus 21 of pressure gas system and vacuum system through a pipe (not shown). The outlet 57 and the substitution gas inlet 58 can exhaust the loading chamber and also introduce a substitution gas by operation of the apparatus 21. Therefore, the loading chamber 18 can be exhausted and pressured independently and, as a result, an atmosphere in a sub-container 15 described hereinafter can coincide with an atmosphere in the loading chamber 18.

The loading chamber 18 protrudes from the main container 11 in the lateral direction and a boat loader 59 is provided on the protruded portion extending along and adjacent to the major container 11. The boat loader 59 has a hook portion at the end on the side of the loading chamber 18, whereby an engaging portion 52 of the support boat 13 can be hooked. The boat loader 59 can move the support boat 13 between the sub-container 15 attached to the loading chamber 18 and the pan 56. The rod of the boat loader 59 is circular in cross section and the connecting portion of the loading chamber 18 and the rod are sealed with an o ring and the like.

A projection portion 60 which can be coupled to the sub-container 15 is provided on the opposite side to the boat loader 59 of the loading chamber 18. A gate valve 61 is provided between the projection portion 60 and the loading chamber 18. The projection portion 60 has an outlet 62 which communicates with the apparatus 21 of the pressure gas system and vacuum system through a pipe (not shown). Pressure in the projection portion 60 is reduced through the outlet 62 by operation of the apparatus 21.

Figure 3D:
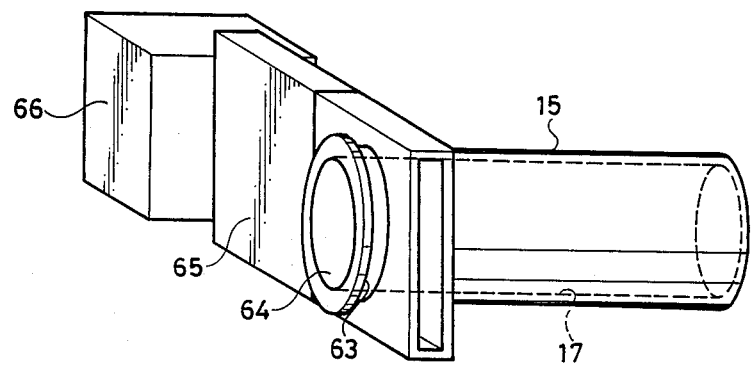
FIG. 3D is a perspective view showing a sub-container.

The above-mentioned sub-container 15 is a member serving as a movable capsule. As shown in FIG. 3D, the sub-container 15 is roughly a member of a cylindrical type and one end thereof is closed and the other end serves as an opening 64 having a flange 63. A gate valve 65 is provided beside the opening 64. The gate valve 65 is driven by a gate valve driving portion 66, so that the same can open and close the opening 64 of the sub-container 15. A treatment chamber 17 formed in the sub-container 15 is formed to be a size capable of housing the support boat 13. The sub-container 15 is removably coupled to the projection portion 60 of the loading chamber 18 and also can be carried by a capsule elevator 16.

As shown in FIGS. 3A and 3B, the capsule elevator 16 has an arm 67. The arm 67 is driven in the longitudinal direction of the sub-container 15, in the lateral horizontal direction and in the vertical direction. The sub-container 15 is placed on the arm 67. The sub-container 15 can be coupled to any of the projection portions 60 of the loading chambers 18 disposed in the four stages stacked in the vertical direction.

A loading plate 68 capable of mounting the support boat 13 is disposed adjacent to the loading chamber 18 which is placed lowermost. A boat loader 69 is placed on the opposite side to the capsule elevator 16 of the loading plate 68. The tip end of the boat loader 69 of the loading plate 68 has a hook portion, which end can engage with the engaging portion 52 of the support boat 13. The boat loader 69 can move the support boat 13 between the treatment chamber 17 in the sub-container 15 disposed lowermost by the capsule elevator 16 and the loading plate 68. A wafer carrier 70 is disposed adjacent the loading plate 68. The wafer carrier 70 can load wafers 12 one unit (for example 25 wafers) at a time to the support boat 13 mounted on the loading plate 68 and also take out the wafers 12 from the support boat 13.

A method of using the thus structured reaction furnace is now described.

Figure 4A:
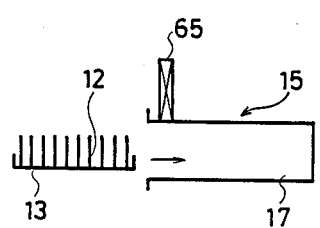
FIGS. 4A–G are views depicting a method of operating the reaction furnace.
Figure 4B:
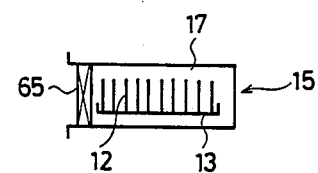
Figure 4C:
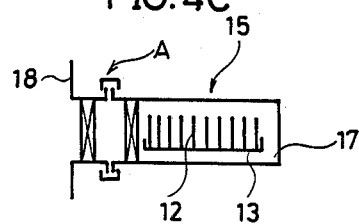

First, the member 12 to be treated such as a semiconductor wafer is placed on the support boat outside the sub-container 15 as shown in FIG. 4A. Since the temperature at that time is a room temperature, no influence is exerted on the surface of the member 12 to be treated. Then, the support boat 13 is transferred into the treatment chamber 17 of the sub-container 15 by a boat loader 69 as shown in FIG. 4B. Then, the treatment chamber 17 is closed by a gate valve 65. Thereafter, the sub-container 15 is transferred by the capsule elevator 16 and connected to the end of the loading chamber 18 by a flange clamp A as shown in FIG. 4C. Then, the gate valve 65 is opened and the atmosphere in the treatment chamber 17 is replaced with a high vacuum atmosphere by letting through an air outlet 62. Also, the atmosphere in the loading chamber 18 has been already replaced with a high vacuum atmosphere.

Figure 4D:
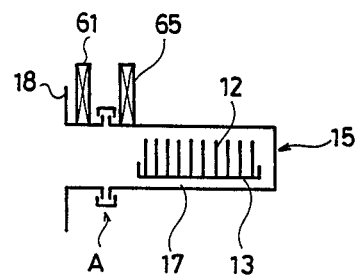
Figure 4E:
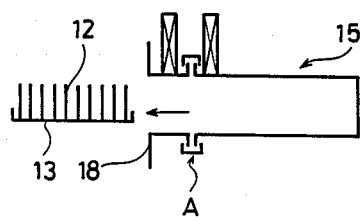
Figure 4F:
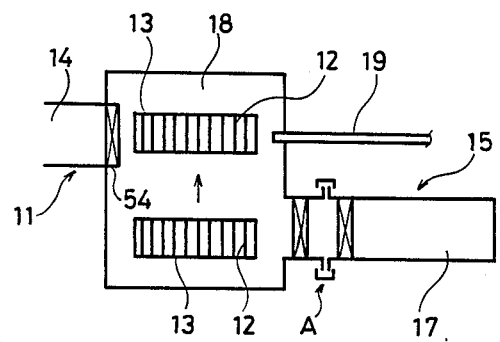
Figure 4G:
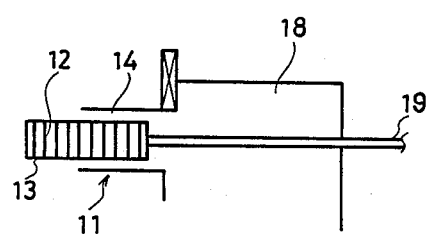

Next, the gate valve 61 is opened as shown in FIG. 4D and the support boat 13 is transferred into the loading chamber 18 by a boat loader 59, as shown in FIG. 4E. Thereafter, the support boat 13 is transferred from the loading chamber 18 of a high vacuum atmosphere shown in FIG. 4F to the treatment chamber 14 of the container 11 by the boat-loader 19, as shown in FIG. 4G.

Thus, the member to be treated can be transferred from the chamber 17 of the sub-container 15 into the treatment chamber 14 of the main container 11.

On the other hand, when the member 12 to be treated is to be taken out of the treatment chamber 14 after the treatment, said operation is performed in the reverse order.

Therefore, by replacing atmospheres of both the treatment chambers 14 and 17 with a predetermined atmosphere, a contact of the member 12 to be treated with the air can be avoided when the temperature is high before and after the treatment. Therefore, formation of an undesirable film can be prevented in forming a film on the member 12 to be treated and a film thickness can be controlled accurately.

In addition, an impure reaction on the surface of the member 12 to be treated is prevented by transferring the member 12 to be treated through the loading chamber 18 in accordance with this embodiment. Alternatively, a reaction in the chamber 18 can be also prevented by replacing the atmosphere in the loading chamber with an atmosphere of an inert gas, for example, such as Ar, He and the like.

Also, the main container 11 was shown as comprising a single treatment chamber 14 in this embodiment. However, the present invention is not limited to this and, of course, it may comprise a plurality of treatment chambers. In such case, a film of multiple layers can be formed on the member 12 to be treated through a single reaction in each treatment chamber. More specifically, the process for forming an oxide film, forming a thin film by a chemical vapor deposition, forming a thin film by a plasma enhanced vapor deposition and forming a thin film by sputtering and the like can be performed in each treatment chamber, with the result that a film of multiple layers can be formed.

Meanwhile, a film of multiple layers can be also formed by providing different treatments from each other sequentially in the same treatment chamber.

Although the present invention has been described and illustrated in detail, it is clearly understood that the same is by way of illustration and example only and is not to be taken by way of limitation, the spirit and scope of the present invention being limited only by the terms of the appended claims.

I claim:

1. A reaction furnace, comprising:
   fixed treatment chamber means for applying a reaction treatment onto a member to be treated placed therein, said fixed treatment chamber means having an atmosphere therewithin, and means for replacing said atmosphere with a predetermined atmosphere;
   movable capsule means for receiving the member to be treated placed therein, said movable capsule means being movable between a receiving location and a delivery location proximate the fixed treatment chamber means and including an atmosphere replaceable with a different atmosphere prior to transference of said member to the fixed treatment chamber;
   connection means connected to said fixed treatment chamber means and connectible to said movable capsule means moved to said delivery location for transferring the member to be treated therebetween.

2. A reaction furnace in accordance with claim 1, further comprising:
   boat means for being transferred from within and between said fixed treatment chamber means, said connection means and said movable capsule means with said member to be treated being held by said boat means.

3. A reaction furnace in accordance with claim 2, wherein said connection means includes loading chamber means disposed between said fixed treatment chamber means and said movable capsule means for allowing entry thereto and delivery therefrom of said boat means, said loading chamber means having an atmosphere and means for replacing it with a predetermined atmosphere.

4. A reaction furnace in accordance with claim 3, which further comprises opening/closing gate valve means arranged between said loading chamber means and both said movable capsule means and fixed treatment chamber means for establishing an open/close state therebetween.

5. A reaction furnace in accordance with claim 4, wherein the atmosphere of said treatment chamber means is a vacuum and reaction gas atmosphere and the atmosphere of said movable capsule means and said loading chamber means is a vacuum atmosphere.

6. A reaction furnace in accordance with claim 5, which further comprises first entry/delivery means coupled to said loading chamber means for moving said boat means between said fixed treatment chamber means and said loading chamber means.

7. A reaction furnace in accordance with claim 6, which further comprises second entry/delivery means coupled to said loading chamber means for moving said boat means between said movable capsule means and said loading chamber means.

8. A reaction furnace in accordance with claim 7, which further comprises atmosphere control means coupled to said loading chamber means for changing the atmosphere of said loading chamber means.

9. A reaction furnace in accordance with claim 8, wherein said loading chamber means comprises coupling means detachably coupled to said movable capsule means for detachably coupling said movable capsule means to said loading chamber means, said coupling means including an outlet for exhausting atmosphere the coupling means.

10. A reaction furnace in accordance with claim 9, wherein said loading chamber means comprises boat carrying means for moving said boat means between a first position and a second position, said first position being on a location adapted for transferring said boat means between said movable capsule means and said loading chamber means, said second position being on a location adapted for transferring said boat means between said fixed treatment chamber means and said loading chamber means.

11. A reaction furnace in accordance with claim 10, wherein said fixed treatment chamber means comprises a plurality of fixed capsules provided in stages stacked in the vertical direction, and said loading chamber means comprises a plurality of loading chambers provided in stages stacked in the vertical direction corresponding to said fixed capsules, respectively.

12. A reaction furnace in accordance with claim 11, which further comprises conveying means for conveying said movable capsule means, said conveying means including means for conveying said movable capsule means in the vertical direction.

13. A reaction furnace in accordance with claim 12, wherein said conveying means further includes means for conveying said movable capsule means in the lateral horizontal direction and in the longitudinal direction of said movable capsule means.

14. A reaction furnace in accordance with claim 13, wherein said atmosphere control means comprises exhausting means for exhausting said loading chamber means and substitution gas introducing means for introducing a substitution gas into said loading chamber means.

15. A reaction furnace in accordance with claim 14, wherein said member to be treated comprises a semiconductor device.

16. A method of operating a reaction furnace including at least one fixed capsule adapted to contain a predetermined atmosphere for providing a reaction process on a member to be treated, at least one movable capsule and at least one connection member connected to the fixed capsule, comprising the steps of:
positioning a member to be treated by the reaction furnace in said movable capsule;
moving and then connecting said movable capsule to said fixed capsule via said connection member;
replacing the atmosphere of said movable capsule with a predetermined atmosphere;
transferring the member to be treated from said movable capsule to said fixed capsule; and
providing in said fixed capsule a reaction treatment to the member to be treated.

17. A method of operating a reaction furnace in accordance with claim 16, wherein the atmosphere of said fixed capsule is a vacuum and reaction gas atmosphere and the atmosphere of said movable capsule is a vacuum atmosphere.

18. A method of operating a reaction furnace in accordance with claim 17, wherein said member to be treated comprises a semiconductor device.

19. The method of claim 18, wherein said movable capsule is attached to the loading chamber and then vacuumized prior to transferring the semiconductor member to the loading chamber.

20. A reaction furnace, comprising:
fixed treatment chamber means for applying a reaction treatment onto a member to be treated placed therein, said fixed treatment chamber means having an atmosphere therewithin, and means for replacing said atmosphere with a predetermined atmosphere;
movable capsule means for receiving the member to be treated placed therein said movable capsule means being movable between a receiving location and a delivery location proximate the fixed treatment chamber means and including an atmosphere replaceable with a different atmosphere prior to transference of said member to the fixed treatment chamber;
connection means connected to said fixed treatment chamber means and connectible to said movable capsule means moved to said delivery location for transferring the member to be treated therebetween;
boat means for being transferred from within and between said fixed treatment chamber means, said connection means and said movable capsule means with said member to be treated being held by said boat means; and
means for replacing said atmosphere in the movable capsule means with said predetermined one after said movable capsule means is attached to the connection means and prior to communication between said movable capsule means and said fixed treatment chamber means.

* * * * *